(12) United States Patent
Hayward

(10) Patent No.: US 8,144,478 B1
(45) Date of Patent: Mar. 27, 2012

(54) CIRCUIT MODULE AND METHOD

(75) Inventor: James L. Hayward, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 565 days.

(21) Appl. No.: 11/173,388

(22) Filed: Jul. 1, 2005

(51) Int. Cl.
*H05K 7/00* (2006.01)
(52) U.S. Cl. .................. 361/760; 174/252; 174/260
(58) Field of Classification Search ............ 361/760; 257/706, 717, 787; 174/252, 260
See application file for complete search history.

(56) References Cited

U.S. PATENT DOCUMENTS

| 5,397,917 | A | | 3/1995 | Ommen et al. |
| 5,548,090 | A | * | 8/1996 | Harris ................... 174/252 |
| 6,597,063 | B1 | * | 7/2003 | Shimizu et al. ........... 257/687 |
| 6,607,928 | B1 | | 8/2003 | Eiles et al. |
| 6,720,649 | B2 | | 4/2004 | Huang |
| 6,784,020 | B2 | | 8/2004 | Lee et al. |
| 7,081,678 | B2 | * | 7/2006 | Liu ........................ 257/778 |
| 7,250,676 | B2 | * | 7/2007 | Wang ..................... 257/723 |
| 2001/0001989 | A1 | * | 5/2001 | Smith .................... 174/52.1 |
| 2004/0120127 | A1 | * | 6/2004 | Hirose .................... 361/760 |
| 2005/0046001 | A1 | | 3/2005 | Warner |
| 2006/0292741 | A1 | * | 12/2006 | Tseng et al. .............. 438/106 |
| 2007/0035013 | A1 | * | 2/2007 | Handa et al. .............. 257/717 |

* cited by examiner

*Primary Examiner* — Yuriy Semenenko
*Assistant Examiner* — Andargie M Aychillhum
(74) *Attorney, Agent, or Firm* — Farjami & Farjami LLP

(57) ABSTRACT

A circuit module having a distance compensation element and a method for manufacturing the circuit module. A thinned semiconductor chip is mounted to a top surface of a support substrate. The thinned semiconductor chip has an upper surface that is spaced apart from the top surface of the support substrate by a first distance. A circuit element having an upper surface is mounted to the support substrate, wherein the upper surface of the circuit element is spaced apart from top surface of the support substrate by a second distance. A height compensation element is mounted over the thinned semiconductor chip and attached to the top surface of the support substrate. The height compensation element has a surface spaced apart from the top surface of the support substrate by a distance greater than or equal to the second distance.

15 Claims, 2 Drawing Sheets

CIRCUIT MODULE AND METHOD

FIELD OF THE INVENTION

The present invention relates, in general, to circuit elements coupled to support substrates and, more particularly, to the heights of the circuit elements.

BACKGROUND OF THE INVENTION

The desire for faster, cheaper, and more efficient semiconductor components has motivated semiconductor component manufacturers to shrink the sizes of the devices fabricated in a semiconductor chip and place one or more semiconductor chips and passive circuit elements such as resistors, capacitors, and inductors in a single package, which single package is typically referred to as a circuit module. The semiconductor chips in a circuit module can be placed in either a horizontal orientation, i.e., beside each other, or a vertical orientation, i.e., vertically stacked on top of each other. In a conventional horizontally oriented circuit module, a semiconductor chip and passive circuit elements are laterally spaced apart from each other on a circuit board and electrically coupled to each other through the circuit board.

A concern with circuit modules is heat removal from the semiconductor chips, the passive circuit elements, and the circuit modules themselves. One technique for improving heat flow from the semiconductor chips is to thin them before mounting them to the circuit board. A drawback with this technique is that thinned semiconductor chips have a different height than the other circuit elements that are mounted to the circuit board. This height difference makes it difficult to attach thermal control features to the semiconductor chips. Because of this height difference, not all semiconductor chips are thinned, which creates a logistical problem for semiconductor manufacturers.

Hence, a need exists for a circuit module that can include semiconductor chips of different thicknesses and a method for manufacturing the circuit module. It would be advantageous for the method and structure to be cost efficient and suitable for integration with a variety of circuit module processes.

SUMMARY OF THE INVENTION

The present invention satisfies the foregoing need by providing a circuit module and a method for manufacturing the circuit module. In accordance with one embodiment, the present invention includes a method for manufacturing a circuit module comprising providing a support substrate having first and second major surfaces. A first circuit element having a major surface is coupled to the first major surface of the support substrate such that the major surface of the first circuit element is spaced apart from the first major surface of the support substrate by a first distance. A second circuit element having a major surface is coupled to the first major surface of the support substrate such that the major surface of the second circuit element is spaced apart from the first major surface of the support substrate by a second distance, wherein the second distance is greater than the first distance. A distance compensation element having a major surface is coupled to the support substrate such that it overlies the first circuit element. The distance compensation element cooperates with the first circuit element so that its major surface is spaced apart from the first major surface of the support substrate by a distance that is greater than or equal to the second distance.

In accordance with another embodiment, the present invention includes a method for compensating for thickness variations of circuit module elements comprising providing a support substrate having first and second major surfaces. A first circuit module element having first and second surfaces is coupled to the first major surface of the support substrate. The first surface of the first circuit module element is proximal to the support substrate and the second surface of the first circuit module element is distal and spaced apart from the first major surface by a first distance. A second circuit module element having first and second surfaces is coupled to the first major surface of the support substrate. The first surface of the second circuit module element is proximal to the support substrate and the second surface of the second circuit module element is distal and spaced apart from the first major surface by a second distance, wherein the second distance is different from the first distance. A height extension feature having a surface is coupled to the second major surface such that its surface is spaced apart from the second surface of the first circuit module element by a third distance.

In accordance with yet another embodiment, the present invention includes a circuit module comprising a support substrate having first and second major surfaces. A first circuit element is coupled to the first major surface. The first circuit element has a surface spaced apart from the first major surface of the support substrate by a first distance. A second circuit element is coupled to the first major surface. The second circuit element has a surface spaced apart from the first major surface of the support substrate by a second distance, wherein the second distance is different from the first distance. A height extension feature is coupled to the support substrate, wherein the height extension feature has a major surface that overlies the first circuit element and is spaced apart from the surface of the first circuit element by a third distance.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a circuit module and a method for manufacturing the circuit module that compensates for variations in semiconductor chip thicknesses. A height or distance compensation element is placed over a circuit module element such as, for example, a semiconductor chip and coupled to a support substrate to promote heat removal from the circuit module in general and from the semiconductor chip in particular.

Figure 1:
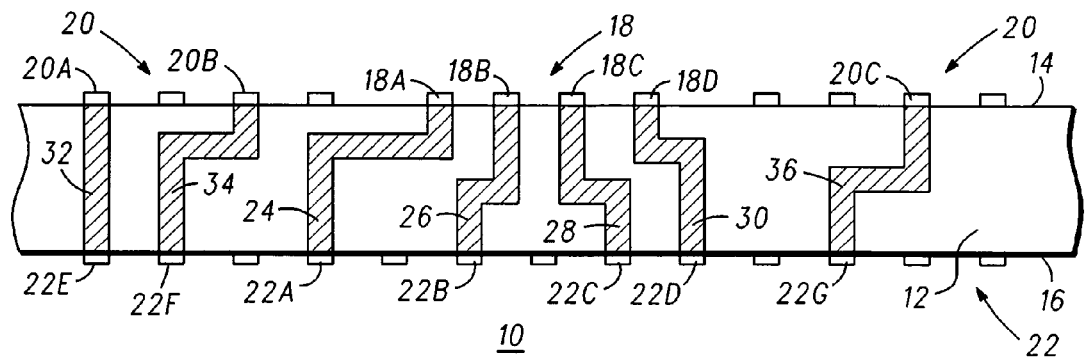
FIG. 1 is a cross-sectional side view of a circuit module at an intermediate stage of manufacture in accordance with an embodiment of the present invention.

FIG. 1 is a cross-sectional side view of a portion of a circuit module 10 at an intermediate stage of manufacture in accordance with an embodiment of the present invention. What is shown in FIG. 1 is a Ball Grid Array (BGA) support substrate 12 having top and bottom surfaces 14 and 16, respectively. BGA support substrate 12 is formed from a resin such as an epoxy resin, a polyimide resin, a triazine resin, a phenolic resin, or combinations thereof. Preferably, the resin material of BGA support substrate 12 is bismaleimidetriazine (BT) resin. Other suitable materials for support substrate 12 include epoxy-glass composites, FR-4, ceramics, or the like. It should be understood that substrate 12 is not limited to being a BGA substrate but may also be a Pin Grid Array (PGA) substrate, a ceramic substrate, a printed circuit board, or the like. A plurality of semiconductor chip bonding pads 18 and a plurality of component bonding pads 20 are formed on top surface 14, and a plurality of interconnect bonding pads 22 are formed on bottom surface 16. Semiconductor chip bonding pads 18A, 18B, 18C, and 18D of plurality of semiconductor chip bonding pads 18 are coupled to corresponding interconnect bonding pads 22A, 22B, 22C, and 22D of plurality of bonding pads 22 through interconnects 24, 26, 28, and 30, respectively. Circuit element bonding pads 20A, 20B, and 20C of plurality of circuit element bonding pads 20 are coupled to corresponding interconnect bonding pads 22E, 22F, and 22G through interconnects 32, 34, and 36, respectively. For the sake of clarity, only four semiconductor chip bonding pads, 18A-18D, three circuit element bonding pads, 20A-20C, and seven interconnect bonding pads, 22A-22G, are identified by alphanumeric reference symbols in FIG. 1. It should be noted that the numbers of bonding pads on surfaces 14 and 16 are not limitations of the present invention. Similarly, only seven interconnects, 24-36, are shown as extending through BGA support substrate 12 in FIG. 1. However, it should be understood that all or nearly all of the bonding pads on surface 14 are coupled to bonding pads 22 on surface 16 or to other bonding pads on surface 14 by interconnects such as interconnects 24-36.

Figure 2:
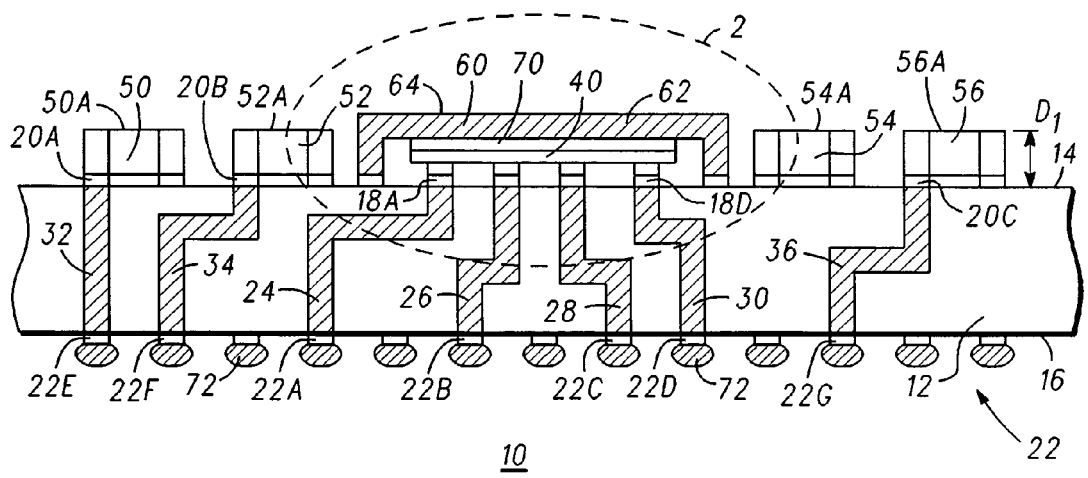
FIG. 2 is a cross-sectional side view of the circuit module of FIG. 1 at a later stage of manufacture.
Figure 3:
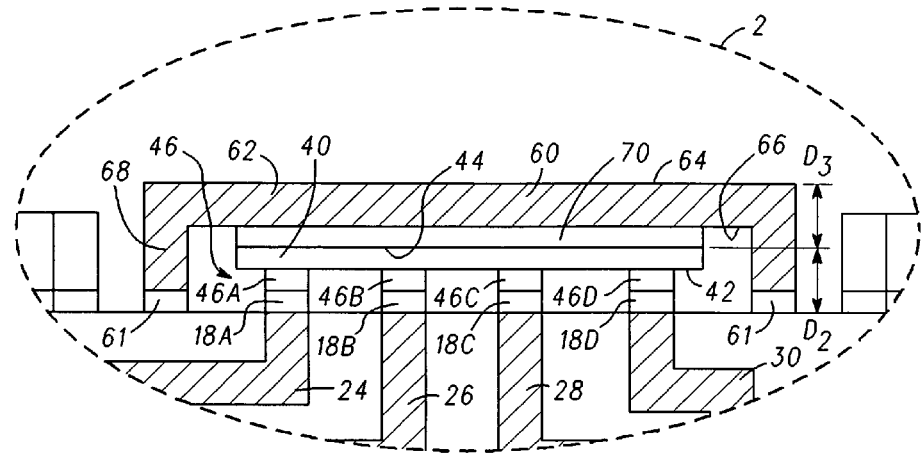
FIG. 3 is an expanded cross-sectional side view of the portion of the circuit module that is within the oval formed by broken line 2 of FIG. 2.

Referring now to FIGS. 2 and 3, a semiconductor chip 40 such as, for example, a microprocessor, having opposing surfaces 42 and 44 and a plurality of bonding pads 46 disposed on a surface 42 is flip-chip mounted to support substrate 12. FIG. 3 is an expanded view of a portion of FIG. 2 within broken line 2. Thus, FIGS. 2 and 3 are described together. Because semiconductor chip 40 is flip-chip mounted to support substrate 12, surface 42 of semiconductor chip 40 is proximal to surface 14 of support substrate 12 and surface 44 of semiconductor chip 40 is distal from surface 14 of support substrate 12. More particularly, bonding pads 46A, 46B, 46C, and 46D of plurality of bonding pads 46 are bonded to bonding pads 18A-18D, respectively, in a flip-chip configuration. Circuit elements 50, 52, 54, and 56 having top surfaces 50A, 52A, 54A, and 56A, respectively, are bonded to corresponding circuit element bonding pads 20. Top surfaces 50A-56A are distal from surface 14 of support substrate 12 while the bottom surfaces are proximal to surface 14 of support substrate 12. Circuit elements 50-56 may be passive circuit elements such as, for example, resistors, capacitors, and inductors, or the like, or active circuit elements such as, for example, transistors, diodes, or the like. In accordance with one embodiment, circuit elements 50 and 56 are chip resistors and circuit elements 52 and 54 are chip capacitors. Semiconductor chip 40 and circuit elements 50-56 are also referred to as circuit module elements.

Circuit elements 50-56 each have top surfaces 50A-56A, respectively, that are above or spaced apart from surface 14 by a distance $D_1$. Surface 42 is above or spaced apart from surface 14 by a distance $D_2$, which is less than distance $D_1$. One reason for the difference between distances $D_1$ and $D_2$ is that semiconductor chip 40 is thinned to facilitate heat flow. Although surfaces 50A-56A are shown and described as being at the same height above surface 14, this is not a limitation of the present invention.

A distance or height compensation element 60 is placed over semiconductor chip 40 and bonded to surface 14 using, for example, an epoxy or an adhesive material 61. In accordance with one embodiment, height compensation element 60 comprises a square-shaped body or platform 62 having a top surface 64, a bottom surface 66, four sides, and legs or vertical supports 68 extending from each of the four sides. It should be noted that the number of sides of distance compensation element 60 is not a limitation of the present invention, i.e., there can be two sides, three sides, or more than four sides. Similarly, the number of legs 68 is not a limitation of the present invention. A thermal interface material 70 is formed on surface 44 and bottom surface 66 is placed in contact with thermal interface material 70. It should be understood that the use of thermal interface material 70 is optional. Supports 68 are bonded to surface 14 using epoxy or adhesive material 61. The lengths of legs 68, the thickness of body 62, or a combination thereof are selected such that when they are coupled to surface 14, top surface 64 is at distance $D_3$ above surface 44. Preferably, the sum of distances $D_2$ and $D_3$ is greater than or equal to distance $D_1$. Thus, top surface 64 is preferably a greater distance or height above surface 14 than is the highest surface of surfaces 50A-56A. Solder balls 72 are coupled to interconnect bonding pads 22. Although solder balls 72 are described and shown as being bonded to interconnect bonding pads 22, it should be understood this is not a limitation of the present invention. For example, pins can be bonded to interconnect bonding pads 22. An advantage of including height compensation element 60 is that it allows coupling a heat sink to semiconductor chip 40 to further decrease the junction temperatures of the semiconductor devices formed in semiconductor chip 40.

Figure 4:
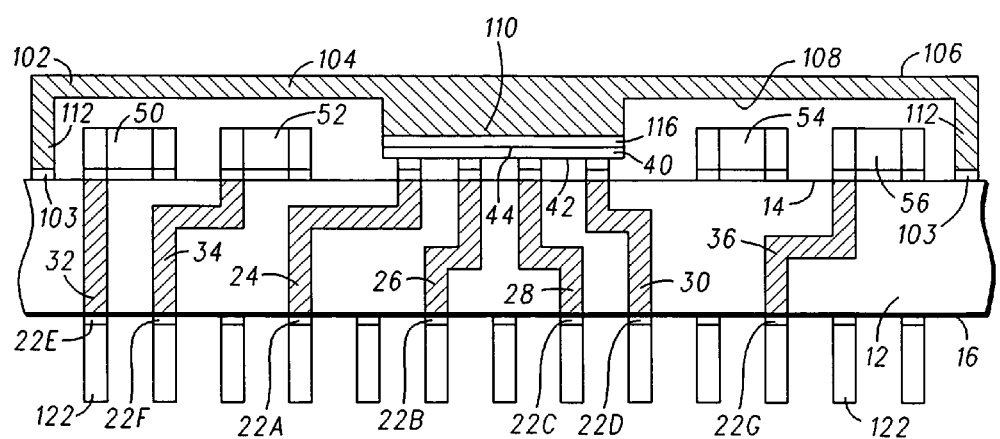
FIG. 4 is a cross-sectional side view of a circuit module in accordance with another embodiment of the present invention.

FIG. 4 is a cross-sectional side view of a portion of a circuit module 100 at an intermediate stage of manufacture in accordance with another embodiment of the present invention. What is shown in FIG. 3 is a substrate 12 having semiconductor chip 40 and circuit elements 50-56 mounted thereon as described with reference to FIGS. 1-3. A distance or height compensation element 102 is placed over semiconductor chip 40 and circuit elements 50-56, and bonded to surface 14 using, for example, an epoxy or an adhesive material 103. In accordance with one embodiment, height compensation element 102 comprises a square-shaped body 104 having a top surface 106, a bottom surface 108, an extension 110 extending from bottom surface 108, a plurality of sides, and legs or supports 112 extending from each of the plurality of sides. A thermal interface material 116 is formed on surface 44 and extension 110 is placed in contact with thermal interface material 116. It should be understood that the use of thermal interface material 116 is optional. Supports 112 are bonded to surface 14 using the epoxy or the adhesive material 103. Height compensation element 102 helps remove heat from semiconductor chip 40 and provides a surface to which heat sinking elements can be mounted. Pins 122 are coupled to interconnect bonding pads 22. Although pins 122 are described and shown as being bonded to interconnect bonding pads 22, it should be understood this is not a limitation of the present invention. For example, solder balls can be bonded to interconnect bonding pads 22. Like height compensation element 60, height compensation element 102 further decreases the junction temperatures of the semiconductor devices formed in semiconductor chip 40.

By now it should be appreciated that a circuit module and a method for manufacturing the circuit module have been provided. An advantage of the present invention is that a heat removal feature can be coupled to a heat generating element such as, for example, a semiconductor chip mounted to a circuit module, independent of the thickness of the semiconductor chip. Thus, the present invention provides a method for compensating for thickness variations of circuit module elements. In addition, the present invention simplifies the semiconductor component manufacturing process because it permits thinning all the semiconductor wafers in a manufacturing facility, rather than thinning some semiconductor wafers and leaving other semiconductor wafers unthinned. This simplifies the process because it eliminates the need to track which semiconductor wafers will be thinned by backgrinding and which will not be thinned. In addition, the method is readily integrable into multi-chip module processing flows in a cost and time efficient manner.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for compensating for thickness variations of circuit module elements, comprising:
    providing a support substrate having first and second major surfaces;
    coupling a first circuit module element to the first major surface, the first circuit module element having first and second surfaces, the first surface proximal to the support substrate and the second surface distal and spaced apart from the first major surface of the support substrate by a first distance;
    coupling a second circuit module element to the first major surface, the second circuit module element having first and second surfaces, the first surface proximal to the support substrate and the second surface distal and spaced apart from the first major surface of the support substrate by a second distance, the second distance different from the first distance; and
    coupling a height extension feature to the second major surface, wherein the height extension feature has a surface that is spaced apart from the second surface of the first circuit module element by a third distance, the height extension feature coupled to the second circuit module element by an extension extending from a bottom surface of the height extension feature and not extending beyond a top surface of the height extension feature.

2. The method of claim 1, wherein coupling the height extension feature to the second major surface includes coupling the height extension feature to the second surface of the first circuit element.

3. The method of claim 1, wherein coupling the height extension feature to the second major surface includes directly coupling the height extension feature to the second major surface.

4. The method of claim 1, wherein the sum of the first and third distances equals at least the second distance.

5. The method of claim 4, wherein coupling the height extension feature to the second major surface includes providing the height extension feature having a platform and at least one vertical support.

6. The method of claim 5, wherein coupling the height extension feature to the second major surface includes coupling the at least one vertical support to the second major surface.

7. The method of claim 5, wherein providing the height extension feature includes providing the at least one vertical support as a leg extending from the platform.

8. A method for compensating for thickness variations of circuit module elements, comprising:
    providing a support substrate having first and second major surfaces;
    coupling a first circuit module element to the first major surface, the first circuit module element having first and second surfaces;
    coupling a second circuit module element to the first major surface, the second circuit module element having first and second surfaces;
    coupling a height extension feature to the second major surface, wherein the height extension feature has a surface that is spaced apart from the second surface of the first circuit module element, the height extension feature coupled to the second circuit module element by an extension extending from a bottom surface of the height extension feature and not extending beyond a top surface of the height extension feature.

9. The method of claim 8, wherein the first circuit module element comprises a major surface spaced apart from the first major surface of the support substrate by a first distance.

10. The method of claim 9, wherein the second circuit module element comprises a major surface spaced apart from the first major surface of the support substrate by a second distance, the second distance greater than the first distance.

11. The method of claim 8, wherein coupling the height extension feature to the second major surface includes coupling the height extension feature to the second surface of the first circuit module element.

12. The method of claim 8, wherein coupling the height extension feature to the second major surface includes directly coupling the height extension feature to the second major surface.

13. The method of claim 12, wherein coupling the height extension feature to the second major surface includes providing the height extension feature having a platform and at least one vertical support.

14. The method of claim 13, wherein providing the height extension feature includes providing the at least one vertical support as a leg extending from the platform.

15. The method of claim 12, wherein coupling the height extension feature to the second major surface includes coupling at least one vertical support to the second major surface.

* * * * *